Aug. 8, 1961 D. E. DEUITCH 2,995,664

TRANSISTOR GATE CIRCUITS

Filed June 1, 1954 2 Sheets-Sheet 1

INVENTOR.
DON E. DEUITCH

BY H. L. Newton

ATTORNEY

Aug. 8, 1961 D. E. DEUITCH 2,995,664

TRANSISTOR GATE CIRCUITS

Filed June 1, 1954 2 Sheets-Sheet 2

INVENTOR.
DON E. DEUITCH

BY H. L. Newton
ATTORNEY

United States Patent Office 2,995,664
Patented Aug. 8, 1961

2,995,664

TRANSISTOR GATE CIRCUITS

Don E. Deuitch, Haddonfield, N.J., assignor to Radio Corporation of America, a corporation of Delaware Filed June 1, 1954, Ser. No. 433,667
3 Claims. (Cl. 307—88.5)

This invention relates in general to logic circuits as used in electronic computers and in particular to gating circuits for performing computer logic functions.

Gating circuits utilizing vacuum tubes have been used extensively in electronic computers. These include coincidence or AND gates which supply an output pulse upon simultaneous application of a plurality of input pulses, and inhibitor gates, wherein the presence of an inhibitor pulse at one input to the gate will prevent the occurrence of an output pulse even though input signals are applied to other input circuits of the gate.

Several types of AND gates and inhibitor gates utilizing vacuum tubes have been incorporated in electronic computers. These gates have the disadvantage of requiring relatively high input signals, so that a computer utilizing vacuum tube gates will be required to handle large signal levels. This may be costly from the standpoint of power because of the large number of gate circuits which are used in a normal computer. A large portion of this power is wasted in the form of heat which is difficult to eliminate and which may cause deterioration of electronic components of the computer.

Diode logic circuits utilizing semiconductor diodes may be more efficient than those employing vacuum tubes, but these circuits have the disadvantage of reducing or attenuating an input signal so that amplification must be used in conjunction therewith. Furthermore, diode gating circuits require biasing from a direct current source.

Reliability of gating circuits is of extreme importance in computer circuits where a great number of gating circuits are used. Failure of one of a large number of gating circuits may render the entire computer inoperative. Basically the process of gating requires a positive and drastic change in the transfer of signals from an input circuit to an output circuit, this change being controllable by pulse signal information. In diode gating circuits this change in transfer of signals is achieved by utilizing the ratio of reverse or nonconducting impedance to the forward or conducting impedance of the diode. In order to secure the required drastic change, this ratio of reverse to forward impedances must be made very high, which normally requires that large input signals be used.

Reliable gating further requires that the plurality of input pulses be present at exactly the same time or, alternatively, requires that the gate circuit have a moderate amount of memory in order to allow for non-coincidence of the input pulses. Most diode gates and gates utilizing vacuum tubes do not include memory.

Accordingly, it is the primary object of the present invention to provide an improved, reliable and efficient gate circuit which effectively may utilize a semiconductor device as the operative element thereof.

It is a further object of this invention to provide an improved transistor gate circuit in which the positive and drastic change in the transfer of signals from an input circuit to an output circuit is secured with relatively low input signal levels.

It is still a further object of the present invention to provide an improved inhibitor gate circuit which operates reliably at relatively low signal levels.

It is a still further object of the present invention to provide an improved coincidence gate circuit which may utilize a transistor device to attain improved, efficient and reliable operation.

It is still another object of the present invention, to provide an improved inhibitor gate circuit having a predetermined degree of memory effective to allow for non-coincidence of the input pulses.

Gating circuits in accordance with the present invention include a semiconductor device or transistor of the junction type. An input pulse signal is applied through a series resistance to the collector of the transistor. The sole source of bias voltage for the collector electrode is provided in response to the input pulse signal. The emitter is connected to a point of substantially fixed reference potential or ground. Output signals are derived between the collector and ground and are a replica of the input signal, since the collector to emitter impedance to the transistor is normally very high.

An inhibitor gate circuit is formed by applying a control signal to the base electrode of the transistor which drives the transistor to saturation, thereby causing the impedance between the collector and emitter electrodes to become very low. The input pulse signal is sharply attenuated by the low shunt resistance of the collector-to-emitter path of the transistor. Under conditions of no control signal the transistor is to present a high impedance path between its collector and emitter electrodes. Thus, either zero bias or a small amount of reverse bias must be applied to the base electrode of the transistor. Inhibiting action is then obtained when a pulse is applied to the base electrode which tends to bias the emitter junction in a forward or conducting direction.

The control signal applied to the base electrode causes the collector to emitter impedance to drop sharply since both collector and emitter junctions are biased in a forward direction. The output voltage under these conditions therefore is extremely low, the collector input pulse having been inhibited by the control signal.

If a bias is applied to the base electrode which causes the emitter junction to be biased in the forward or conducting direction, no output pulse will be generated when the collector input pulse is applied. If a relatively large control signal, poled to bias the emitter junction in the reverse or nonconducting direction, is applied to the base electrode, the impedance of the collector-to-emitter path rises sharply. A simultaneously applied collector input pulse will then cause an output pulse to appear between the collector and ground. This output pulse therefore appears only upon the coincidence of two input pulses. Operation of the circuit in this mode yields an AND gate.

The novel features that are considered characteristic of this invention are set forth with particularity in the appended claims. The invention itself, however, both as to its organization and method of operation as well as additional objects and advantages thereof, will be best understood from the accompanying drawings in which:

Figure 1:
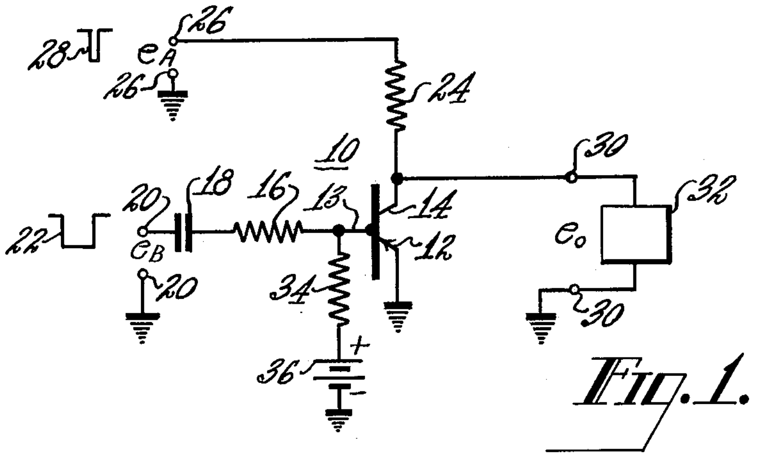
FIGURE 1 is a schematic circuit diagram of a transistor inhibitor gate circuit in accordance with the present invention.

Referring now to the drawings wherein like reference characteristics are applied to like elements throughout, and particularly to FIGURE 1, a transistor 10 having an emitter electrode 12 connected to ground further includes a collector electrode 14 and a base electrode 13. One of a pair of signal input terminals 26 is connected to the collector electrode 14 through a series resistor 24.

The other of the pair of input terminals is connected to a point of substantially fixed reference potential or ground. Output signals are derived across a pair of output terminals 30, one of which is connected directly to the collector electrode and the other of which is connected to ground. A utilization device 32 is connected across the output terminal 30. Thus, a signal 28 applied to the pair of input terminals 26 will appear at the output terminals 30 provided that the impedance between the collector electrode 14 and the emitter electrode 12 is high.

A control signal applied at a pair of control input terminals 20 is coupled to the base electrode 13 through the series combination of a capacitor 18 and a resistor 16. This control signal may be derived from the output of a bistable multivibrator circuit or flip-flop and may be in the form of a pulse or a change in voltage level. When the voltage level which appears at the control input terminals is in such a direction to bias the emitter junction the impedance between the collector electrode 14 and the emitter electrode 12 becomes very low, thereby inhibiting output signals at the pair of output terminals 30.

With zero control signal input, the transistor 10 is operated under bias conditions for the impedance between the collector electrode 14 and the emitter electrode 12 to be very high. Zero base current biasing will in many cases offer suitable operating conditions for the transistor 10. The capacitor 18 prevents any direct currents from flowing into the gate circuit from the control input apparatus. It is noted that the capacitor 18 may in addition serve the further function of providing differentiation of the control input signal.

In order to prevent leakage current from the collector electrode to the base electrode of the transistor from causing false inhibiting action under adverse conditions of operation such as high temperature or high humidity, a reverse bias may be applied to the base electrode 13. Means for providing this reverse bias are illustrated in FIGURE 1 as the series combination of a battery 36 and a resistor 34 connected between the base electrode 13 and ground. The battery 36 is poled to provide a reverse bias on the base electrode 13 relative to the emitter electrode 12. In operation the control input signal which is applied to the input terminals 20 must be large enough to overcome the reverse bias applied by the battery 36 and resistor 34 and to drive the transistor to the low impedance or saturation condition. The resistor 16 will prevent the base electrode circuit from adversely loading the source of signals 22.

Figure 2:
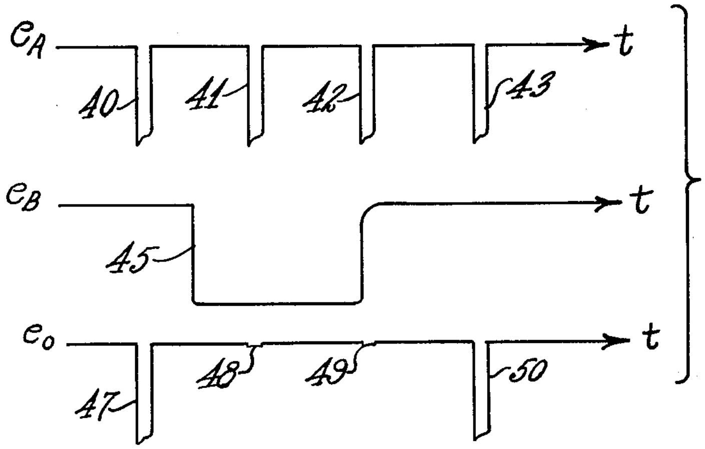
FIGURE 2 is a graph showing curves illustrating, by means of input and output voltage waveforms, the certain operational characteristics of the circuit of FIGURE 1.

Referring to FIGURE 2 along with FIGURE 1, the curve labeled $e_A$, which includes a series of input pulses 40, 41, 42 and 43, represents a typical pulse input signal as applied to the pair of input terminals 26. The curve labeled $e_B$ graphically represents the control voltage signal as it would be applied to the control terminals 20. It is noted that the curves of FIGURE 2 all have a common time base. The output voltage appears across the pair of output terminals 30 as shown in the curve labeled $e_O$. It is thus seen that in the absence of control signal 45 an output signal 47 appears across the pair of output terminals 30 in response to the input pulse 40. When the control signal 45 is applied to the pair of control terminals 20, the output signal which would appear in response to the input signal 41 is inhibited or suppressed as shown by the very small output signal 48.

A further aspect of the present invention is shown with respect to the output signal 49 which is obtained in response to the input signal 42. Although the control signal 45 is terminated slightly before the input signal 42 is received at the input terminals 26, a small degree of memory exists in the transistor and causes the output signal to be inhibited. This memory quality which performs a delayed gating action is caused by the storage of conduction carriers in the base region of the transistor connected with the base electrode 13. The control input signal causes many electrical charge carriers to be injected into this region. Upon cessation of the control input signal the charge carriers do not immediately leave this region, so that the impedance between the collector electrode 14 and the emitter electrode 12 remains low for a short period of time after cessation of the control input signal.

The amount of memory action is controllable by the value of reverse bias current which is applied to the base electrode 13 and may be adjusted by adjusting the value of the resistor 34.

Very shortly thereafter, however, the circuit returns to the normal quiescent condition wherein an output signal 50 is obtained in response to an input signal 43 in the absence of the control signal 45.

Figure 3:
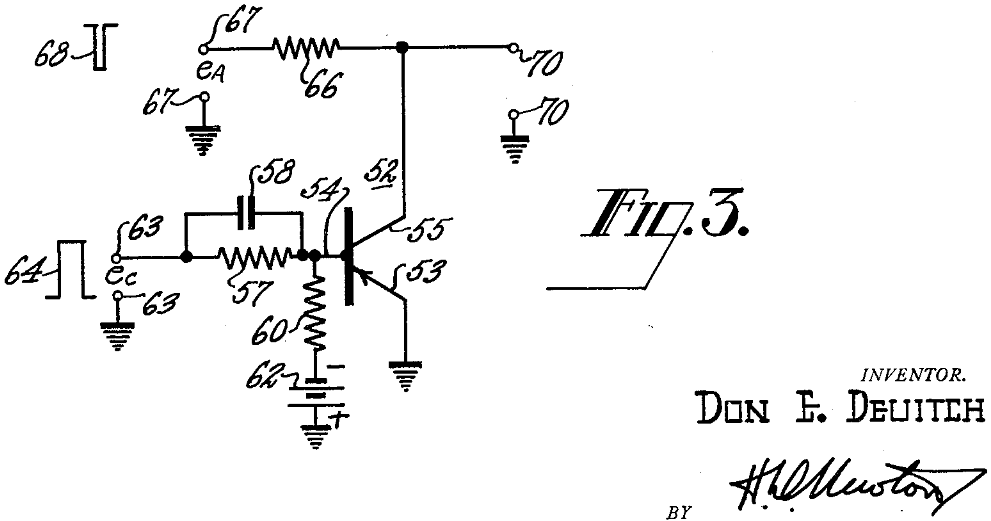
FIGURE 3 is a schematic circuit diagram illustrating a coincidence or AND gate circuit in accordance with the present invention.

In FIGURE 3, a gate circuit is illustrated in which an output signal is obtained in response to the simultaneous application of an input signal 68 and a control signal 64. The input signal 68 is applied to a pair of input terminals 67, one of which is connected to ground and the other of which is connected through a resistor 66 to one of a pair of output terminals 70. The other of the pair of output terminals is connected to ground. A transistor 52 has an emitter electrode 53 which is connected to ground and further includes a base electrode 54 and a collector electrode 55 which is connected to the junction of the resistor 66 and the output terminal 70. The control signal 64 is applied to a pair of input terminals 63, one of which is connected to ground and the other of which is coupled through the parallel combination of a resistor 57 and a capacitor 58 to the base electrode 54.

A bias network consisting of the series combination of a source of potential illustrated as a battery 62 and a resistor 60 is connected between the base electrode 54 and ground. The battery 62 is poled to bias the emitter junction in the forward direction. In the absence of a control signal, therefore, the impedance between the collector electrode 55 and the emitter electrode 53 is very low, so that no output signal will be obtained at the pair of output terminals 70 in response to the input signal 68. The control signal 64 must have the correct polarity to bias the emitter junction in the reverse or non-conducting direction. Application of a control signal 64 to the pair of control terminals 63 causes the emitter junction to become biased in the reverse direction. The impedance between the collector electrode 55 and emitter electrode 53 therefore rises, allowing an input signal 68 applied to the input terminals 67 to appear at the pair of output terminals 70.

Thus it is seen that a coincidence or AND gate in accordance with the present invention is similar to the inhibitor gate of the present invention except that the direction of bias applied to the base electrode is reversed and the polarity of the control signal is also reversed.

The resistor 57 serves to isolate the pair of control input terminals 63 from the base electrode 54. The capacitor 58 serves to differentiate the input signal to effect more rapid gating action.

Figure 4:
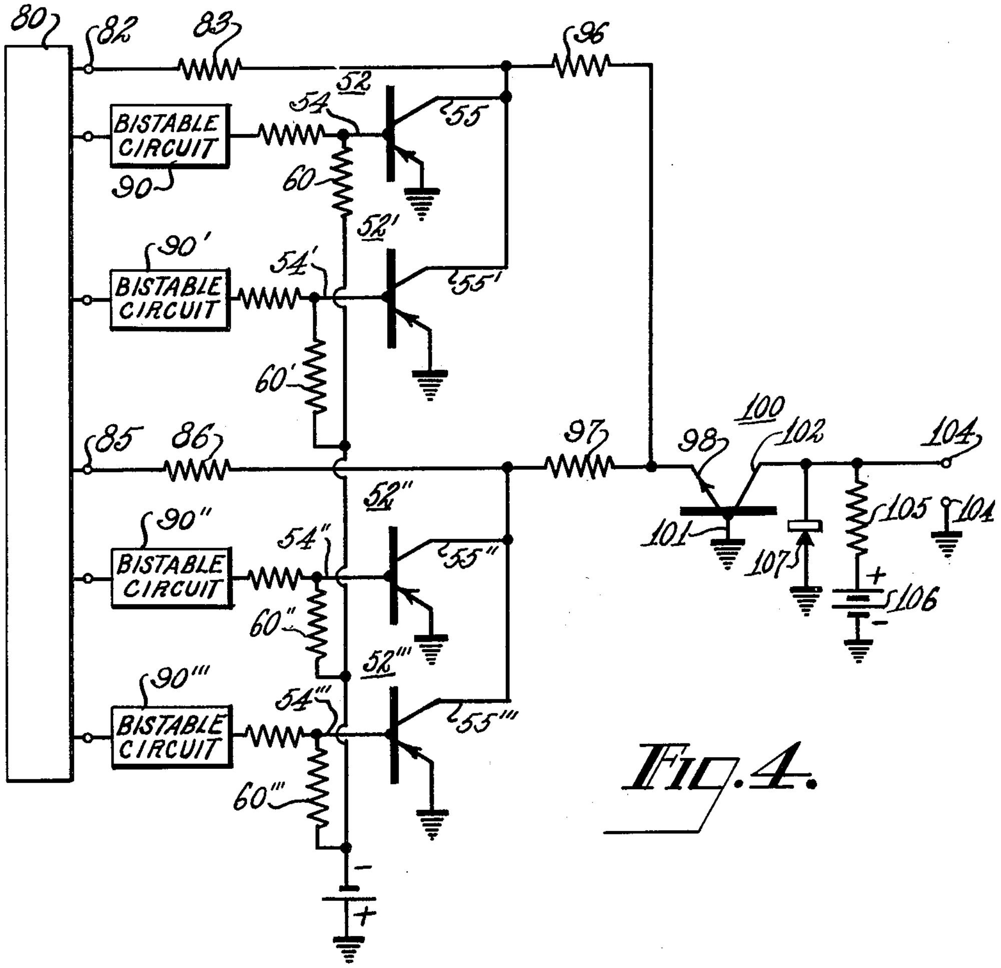
FIGURE 4 is a schematic circuit diagram showing an application to an electronic computer system of a gate circuit in accordance with the present invention.

Referring now to FIGURE 4, a logic circuit embodying four coincidence gate circuits in accordance with the present invention is shown. The circuit illustrated may be a portion of an automatic computer, the arrangement of the gate circuits being in accordance with a predetermined logical plan. Input connections from the previous stages of the computer are represented in the drawing by the block 80, from which a plurality of logic signals may be derived. The four coincidence gate circuits are seen to be similar to the circuit of FIGURE 3 and are seen to include transistors 52, 52′, 52″ and 52‴.

A series of input signals applied at an input terminal 82 are coupled through a resistor 83 to a pair of collector electrodes 55 and 55′ connected in common. In like manner, a different series of input signals are coupled from an input terminal 85 through a resistor 86 to the pair of collector electrodes 55″ and 55‴ connected in common. Control signals are applied to the base electrodes 54, 54′, 54″ and 54‴, from four bistable circuits 90, 90′, 90″ and 90‴ which in turn are controlled by pulses applied in accordance with a predetermined logical plan from the block 80. Bias is applied to the base electrodes 54, 54′, 54″ and 54‴ by the resistors 60, 60′, 60″ and 60‴ which are connected between the respective base electrodes and a common source of potential poled to bias each of the emitter junctions in the forward direction.

Output signals from each pair of collector electrodes are coupled through a pair of resistors 96 and 97 to the emitter electrode 98 of a transistor 100. The transistor 100 further includes a base electrode 101 which is connected to ground and a collector electrode 102 which is connected to one of a pair of output terminals 104. Energizing current is supplied to the collector electrode 102 by the series combination of a resistor 105 and a source of energizing potential illustrated as a battery 106 connected between the collector electrode 102 and ground. A diode 107 connected between the collector electrode and ground prevents the transistor 100 from being driven into saturation in response to large input signals. Speed of operation is thereby increased.

Presence of an input signal at the terminal 82 will cause an output signal current to pass through the resistor 96 if and only if control pulses have been applied to the bistable circuits 90, and 90′ which in turn provide signal inputs to the base electrodes 54 and 54′. Thus the circuit including the two transistors 52 and 52′ are seen to form a multiple AND gate. Likewise, for an output current pulse to flow through the resistor 97 in response to an input pulse applied at the input terminals 85, control signals must have been applied to the two bistable circuits 90″ and 90‴. The circuit including the transistors 52″ and 52‴ will therefore also form a multiple input AND gate. An output pulse will appear at the pair of output terminals 104 in response to a pulse of current flowing through either the resistor 96 or the resistor 97. The transistor 100 and its associated circuit is thus seen to be an OR gate or buffer amplifier.

The circuit of FIGURE 4 illustrates a typical application of the gate circuit of the present invention and it is apparent that this gate could be used in any number of logical arrangements.

Reliable gating of computer signals is extremely desirable where many such circuits are in use. The gate circuit of the present invention provides this reliability by virtue of the drastic change in impedance between the collector and emitter electrodes of a transistor when the transistor is switched between the cut-off and saturation condition. The high degree of reliability of this gate circuit may be obtained without large input signal levels being required. Efficient operation of computer logic circuits is thereby possible with the use of the gate circuit of the present invention.

What is claimed is:

1. A transistor gate circuit comprising, in combination, a junction transistor including base, emitter and collector electrodes and defining a current carrying path between said collector and emitter electrodes, said emitter electrode being connected to ground, pulse signal input means coupled to said collector electrode, a resistor connected in series relation between said pulse signal input means and said collector electrode, said pulse signal input means providing in response to an applied signal the sole source of bias voltage for said collector electrode, direct current supply means connected with said base electrode for establishing a fixed bias current flow therein, a source of control signals coupled to said base electrode to abruptly change said bias current, and a gated signal output circuit coupled between said collector and emitter electrodes.

2. A transistor gate circuit comprising, in combination, pulse input means including a pair of pulse input terminals, a junction transistor having base, emitter and collector electrodes and defining a current carrying path between said collector and emitter electrodes, circuit means connected between said pulse input terminals including an impedance element and said current carrying path connected in serial relation, said pulse input means providing in response to an applied signal the sole source of bias voltage for said collector electrode, a pair of output terminals connected with said collector and emitter electrodes, a source of fixed bias current connected between said base and emitter electrodes, and pulse control means coupled between said base and emitter electrodes for alternatively rendering the impedance of said current carrying path substantially greater and substantially smaller than the impedance of said element, whereby gating action is provided for signals transmitted through said circuit.

3. A transistor gate circuit comprising, in combination, a junction transistor having base, emitter and collector electrodes and defining a current carrying path between said collector and emitter electrodes, pulse signal input means coupled with said collector electrode and providing response to an applied pulse signal from said means the sole source of bias voltage for said collector electrode, an impedance element being connected between said means and said collector electrode, an output circuit connected with said collector and emitter electrodes, a source of fixed bias current connected between said base and emitter electrodes having a predetermined polarity, and pulse control means for applying signals to said base electrode having a polarity opposite to said predetermined polarity for abruptly changing the impedance of said current carrying path in response to said control signals, whereby gating action is provided for signals transmitted through said circuit.

References Cited in the file of this patent

UNITED STATES PATENTS

| | | |
|---|---|---|
| 2,594,449 | Kircher | Apr. 29, 1952 |
| 2,601,096 | Creamer et al. | June 17, 1952 |
| 2,663,800 | Herzog | Dec. 22, 1953 |
| 2,670,445 | Felker | Feb. 23, 1954 |
| 2,676,271 | Baldwin | Apr. 20, 1954 |
| 2,728,857 | Sziklai | Dec. 27, 1955 |

OTHER REFERENCES

Publication: A Method of Designing Transistor Trigger Circuits, by Williams et al. in Proc. Inst. of Elec. Eng. (British), vol. 100, part 3, January 1953; pages 243–244.

Publication: A Versatile Transistor Circuit, by Cooke-Yarborough in Proc. Inst. of Elec. Eng. (British), vol. 101, part 2, No. 83, October 1954; pages 567–568.